United States Patent
Long et al.

(10) Patent No.: US 7,382,615 B2
(45) Date of Patent: Jun. 3, 2008

(54) HEAT DISSIPATION DEVICE

(75) Inventors: Jun Long, Shenzhen (CN); Hao Li, Shenzhen (CN); Tao Li, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/309,905

(22) Filed: Oct. 26, 2006

(65) Prior Publication Data

US 2008/0049397 A1 Feb. 28, 2008

(30) Foreign Application Priority Data

Aug. 25, 2006 (CN) .................. 2006 1 0062290

(51) Int. Cl.
*H05K 7/20* (2006.01)
(52) U.S. Cl. .................. 361/697; 165/80.3; 165/121; 361/695; 361/703
(58) Field of Classification Search ................ 165/121; 361/694–695, 697
See application file for complete search history.

(56) References Cited

U.S. PATENT DOCUMENTS

| | | | |
|---|---|---|---|
| 5,495,392 A * | 2/1996 | Shen | 361/697 |
| 6,449,152 B1 * | 9/2002 | Lin | 361/697 |
| 6,507,491 B1 * | 1/2003 | Chen | 361/697 |
| 6,654,246 B2 | 11/2003 | Wu | |
| 6,816,373 B2 * | 11/2004 | Lee et al. | 361/697 |
| 6,973,962 B2 * | 12/2005 | Hwang et al. | 165/80.3 |
| 7,044,204 B2 * | 5/2006 | Chen et al. | 165/122 |
| 7,215,548 B1 * | 5/2007 | Wu et al. | 361/703 |
| 7,269,010 B2 * | 9/2007 | Yu et al. | 361/697 |
| 2004/0066624 A1 * | 4/2004 | Lee et al. | 361/697 |

* cited by examiner

*Primary Examiner*—Gregory D Thompson
(74) *Attorney, Agent, or Firm*—Jeffrey T. Knapp

(57) ABSTRACT

A heat dissipation device for an electronic unit includes a heat sink (10), a pair of fan holders (30, 40) and a fan (50) mounted on the heat sink via the fan holders. The heat sink includes a base (11) with a plurality of fins (15) extending upwardly therefrom along a lateral direction thereof. The base forms a pair of lateral walls at two opposite lateral sides thereof. The fins are sandwiched between the lateral walls. A pair of supporting plates (17) extend from the lateral walls for mounting the fan holders on the heat sink. The fan holders cooperate with the lateral walls of the heat sink to encompass a top of the fins to prevent airflow generated by the fan from escaping from the top of the fins.

17 Claims, 3 Drawing Sheets

HEAT DISSIPATION DEVICE

FIELD OF THE INVENTION

The present invention relates to a heat dissipation device, and particularly to a heat dissipation device having a pair of fan holders for achieving greater heat dissipation efficiency.

DESCRIPTION OF RELATED ART

As computer technology continues to advance, electronic components such as central processing units (CPUs) of computers are made to provide faster operational speeds and greater functional capabilities. When a CPU operates at a high speed in a computer, its temperature undergoes rapid increase. Cooling is especially important for the CPU of the computer. Without proper cooling, the heat generated by the CPU can quickly cause the CPU to overheat and damage the CPU. It is therefore desirable to dissipate the heat quickly, for example by using a heat sink system assembled within the computer, so that the CPU of the computer operates within a normal temperature range.

A related heat sink system mounted on CPUs generally includes a heat sink, a fan and a pair of fan holders for mounting the fan on a top of the heat sink. U.S. Pat. No. 6,654,246 B2 shows an example of this kind of heat sink system. The fan holders comprise a pair of locking plates which are parallel to the fins and locked onto two opposite outmost fins of the heat sink by screws. However airflow generated by the fan is prone to escape from gap between the top of the fins and a bottom of the fan. There is a high flow resistance in a central portion of the heat sink, and cold air therefore can not enter the central portion of the heat sink, thereby reducing heat dissipation efficiency of the heat sink system. Therefore, the heat generated by the CPU can not be transmitted to the fins effectively and quickly.

What is needed, therefore, is a heat dissipation device which can quickly and efficiently transfer heat away from an electronic unit to improve cooling performance of the heat dissipation device.

SUMMARY OF THE INVENTION

According to a preferred embodiment of the present invention, a heat dissipation device for an electronic unit comprises a heat sink, a pair of fan holders and a fan mounted on the heat sink via the fan holders. The heat sink includes a base with a plurality of fins extending upwardly therefrom along a lateral direction thereof. The base forms a pair of lateral walls at two opposite lateral sides thereof. The fins are sandwiched between the lateral walls. A pair of supporting plates extend from the lateral walls for securing the fan holders on the heat sink. The fan holders are secured between bottom surfaces of the supporting plates and tops of higher ones of the fins. The fan holders cooperate with the lateral walls of the heat sink to encompass a top of the fins to prevent airflow generated by the fan from escaping from the top of the fins.

Other advantages and novel features of the present invention will become more apparent from the following detailed description of preferred embodiment when taken in conjunction with the accompanying drawings, in which:

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present device. Moreover, in the drawings, like reference numerals designate corresponding parts throughout the several views.

DETAILED DESCRIPTION OF THE INVENTION

Figure 1:
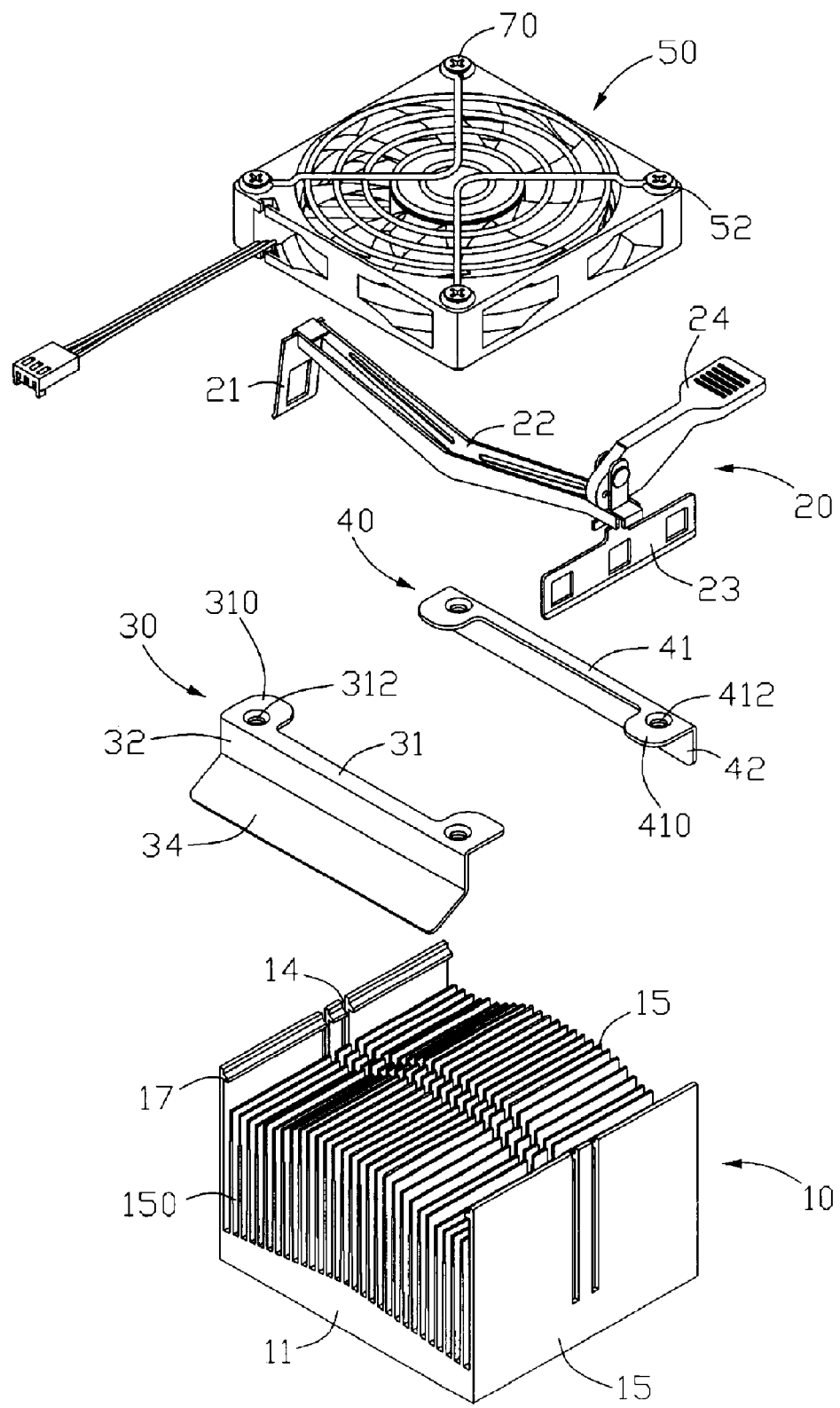
FIG. 1 is an exploded isometric view of a heat dissipation device in accordance with an embodiment of the present invention.

Referring to FIG. 1, a heat dissipation device in accordance with a preferred embodiment of the present invention comprises a heat sink 10, a fan 50, a first and second discrete fan holders 30, 40 mounting the fan 50 onto the heat sink 10 and a clip 20 for securing the heat sink 10 on a main heat-generating electronic component such as a CPU (not shown) located on a printed circuit board (not shown).

The heat sink 10 comprises a base 11 having a bottom face for contacting with the CPU and a top face on an opposite side to the bottom face, and a plurality of spaced and parallel fins 15 integrally extending upwardly from the top face of the base 11 along a lateral direction of the base 11. The base 11 has an arc-shaped cross section, i.e., a middle portion of the base 11 being thicker than two lateral sides of the base 11. A plurality of channels 150 are defined between the fins 15. The fins 15 on the middle of the base 11 are higher than that on the lateral sides of the base 11, but two outmost fins 15 at two opposite outmost sides of the heat sink 10 are the highest. Except for the two outmost fins 15 which are the highest, the other fins 15 on the base 11 have an arc-shaped end at a top of the heat sink 10. A pair of slots 14 are longitudinally defined in the middle portion of the fins 15 for receiving the clip 20 therein. The slots 14 extend downwardly to the top surface of the base 11. Each of the outmost fins 15 has a supporting plate 17 extending inwardly and horizontally along the lateral direction of the fins 15. The supporting plates 17 adjacent to top edges of the two outmost fins 15 are perpendicular to the two outmost fins 15 and located above the highest top of the other fins 15.

Figure 2:
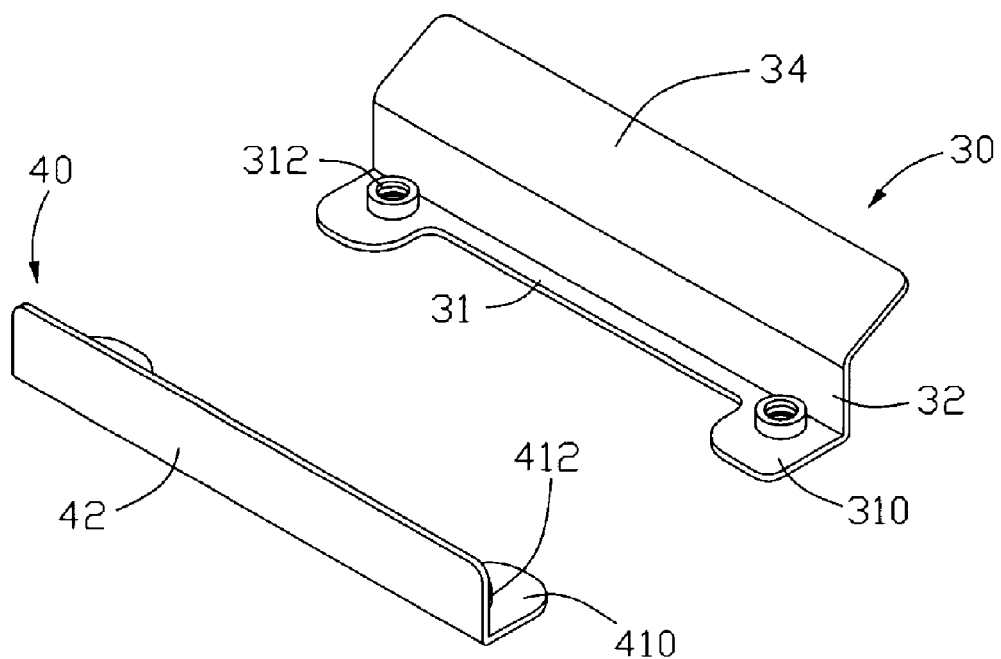
FIG. 2 is an isometric view of fan holders of the heat dissipation device of FIG. 1, but shown from an opposite aspect.

Referring also to FIG. 2, the first and second fan holders 30, 40 have similar configuration. Each of the first and second fan holders 30, 40 comprises a mounting plate 31, 41 and a baffle plate 32, 42 integrally extending perpendicularly and downwardly from an outer edge of the mounting plate 31, 41. A pair of tabs 310, 410 extend horizontally and perpendicularly from opposite ends of the mounting plate 31, 41. A protruding post 312, 412 extends downwardly from each tab 310, 410. Each protruding post 312, 412 defines a through hole having internal threads therein. A guiding plate 34 extends slantingly and downwardly from a bottom end of the baffle plate 32 of the first fan holder 30.

The clip 20 comprises a V-shaped longitudinal portion 22 at a center thereof, first and second locking arms 21, 23 extending downwardly from opposite ends of the longitudinal portion 22 and an operation portion 24 connecting with the second locking arm 23.

Figure 3:
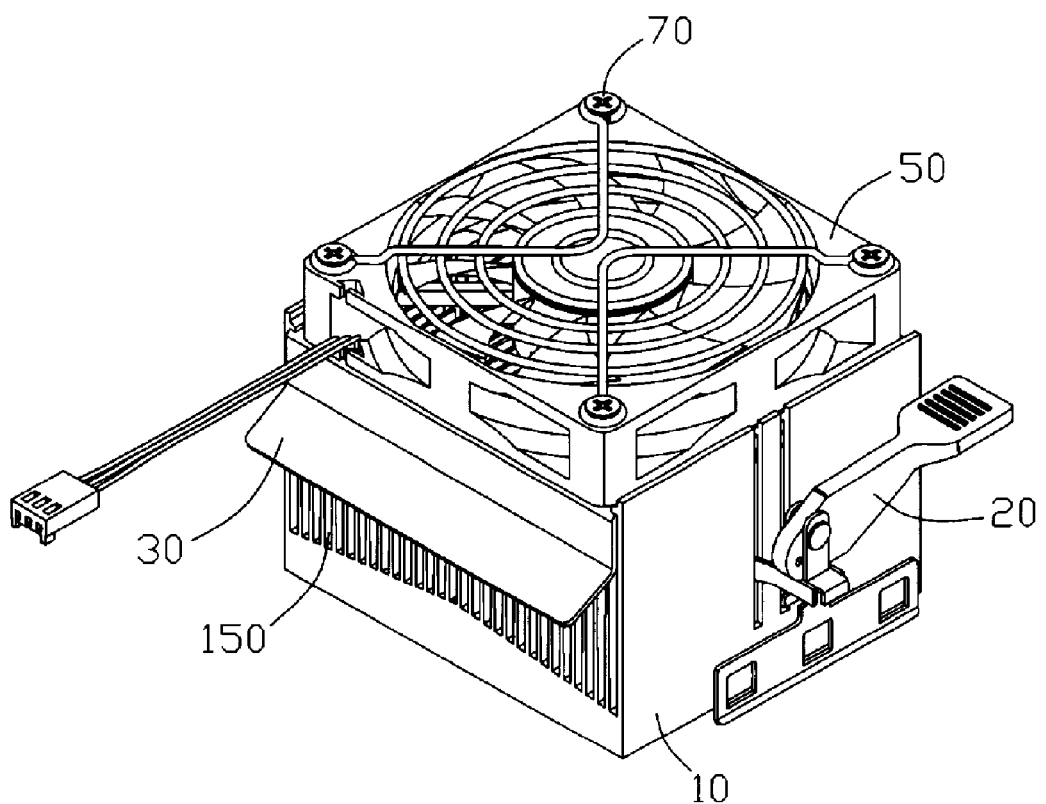
FIG. 3 is an assembled view of FIG. 1.

Referring also to FIG. 3, in assembly, the longitudinal portion 22 of the clip 20 is received in the slots 14 of the heat sink 10. The first and second fan holders 30, 40 are placed on the top of the heat sink 10 and surround two opposite lengthwise extremities of the fins 15. The mounting plates 31, 41 of the first and second fan holders 30, 40 are sandwiched between the two outmost fins 15 and abut against a bottom surface of the supporting plates 17 of the heat sink 10. A central portion of the mounting plates 31, 41 contacts the higher fins 15 on the middle of the base 11 of the heat sink 10. The baffle plates 32, 42 of the first and second fan holders 30, 40 are perpendicularly placed on front and rear sides of the heat sink 10. Thus, the two outmost fins 15 and the baffle plates 32, 34 cooperatively encompass the top of the fins 15 located between the two outmost fins 15. The fan 50 is placed on the top of the heat sink 10, wherein front and rear bottom sides of the fan 50 contact the mounting plates 31, 41. A plurality of screws 70 extends through the fan 50 and screws into the protruding post 312, 412 of the mounting plates 31, 41. Thus, the fan 50 and the fan holders 30, 40 are connected together and cooperatively mounted on the heat sink 10. In the present invention, the supporting plates 17 can limit an upward movement of the fan holders 30, 40. Due to an enclosure of the fan holders 30, 40 and the two outmost fins 15 at sides of the top of the heat sink 10, an airflow generated by the fan 50 cannot escape from the top of heat sink 10. Thus, all the airflow enters the heat sink 10 along the channels 150 between the fins 15 and takes heat away from the CPU. Additionally, by the provision of the guiding plate 34 of the fan holder 34, a part of the airflow in the heat sink 10 flows towards the other electronic components adjacent to the CPU to take away heat from the other electronic components. Therefore, the airflow generated by the fan 50 can cool not only the CPU but also the other electronic components. Accordingly, the efficiency of the heat dissipation device is significantly improved.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device, comprising:
   a heat sink comprising a base for contacting with an electronic unit and a plurality of fins extending upwardly from the base along a lateral direction of the base;
   two outmost fins having a larger height than other fins between the two outmost fins, a pair of opposite supporting plates inwardly extending from the two outmost fins;
   two discrete fan holders being attached on top portions of the other fins and surrounding two opposite lengthwise extremities of the other fins, the two discrete fan holders abutting against the supporting plates; and
   a fan mounted on a top of the fan holders.

2. The heat dissipation device as described in claim 1, wherein each of the fan holders comprises a mounting plate for mounting the fan thereon and a baffle plate integrally extending perpendicularly and downwardly from an outer edge of the mounting plate.

3. The heat dissipation device as described in claim 2, wherein the mounting plates of the fan holders are sandwiched between the two outmost fins and abut against bottom surfaces of the supporting plates of the heat sink, and the baffle plates of the fan holders surround the two opposite lengthwise extremities of the other fins.

4. The heat dissipation device as described in claim 1, wherein each of the supporting plates extends horizontally and inwardly along the lateral direction of the fins.

5. The heat dissipation device as described in claim 4, wherein the fan abuts against top surfaces of fan holders.

6. The heat dissipation device as described in claim 1, wherein the fan is mounted on the fan holders via screws.

7. The heat dissipation device as described in claim 1, wherein a guiding plate extends slantingly and downwardly from a bottom end of a baffle plate of one of the fan holders for conducting a part of airflow generated by the fan to flow toward other electronic components.

8. The heat dissipation device as described in claim 1, wherein the base has an arc-shaped cross section, a middle portion of the base being thicker than two lateral sides of the base.

9. The heat dissipation device as described in claim 8, wherein the fins on the middle of the base are higher than that on the lateral sides of the base, but the two outmost fins at two opposite outmost sides of the heat sink are the highest.

10. The heat dissipation device as described in claim 8, wherein a pair of slots are longitudinally defined in a middle portion of the fins for receiving a clip therein.

11. A heat sink assembly, comprising:
    a heat sink comprising a base with a plurality of fins extending upwardly therefrom along a lateral direction thereof, the base forming a pair of lateral walls at two opposite lateral sides thereof, the fins being sandwiched between the lateral walls, a pair of supporting plates extending from the lateral walls; and
    two discrete fan holders longitudinally attached to a top portion of the fins, the fan holders connecting with a fan and abutting against the supporting plates of the heat sink, the fan holders cooperating with the lateral walls of the heat sink to encompass a top of the fins to prevent airflow generated by the fan from escaping from the top of the fins.

12. The heat dissipation device as described in claim 11, wherein a pair of screw holes adjacent to the lateral walls of the heat sink are defined in each of the fan holders for allowing the fan to be seated thereupon.

13. The heat dissipation device as described in claim 12, wherein each of the fan holders provides an upward flat horizontal surface spanning between the two screw holes for allowing the fan to be seated thereupon.

14. The heat dissipation device as described in claim 13, wherein each of the fan holders provides a downward flat vertical surface abutting against two opposite longitudinal extremities of the fins.

15. The heat dissipation device as described in claim 11, wherein a guiding plate extends slantingly and downwardly from a bottom end of the baffle plate of one of the fan holders for conducting a part of airflow generated by the fan to flow toward other electronic components.

16. A heat dissipation device comprising:
    a heat sink having a base with a bottom surface adapted for contacting with a heat-generating electronic component and a plurality of fins extending upwardly from a top surface of the base, wherein the fins have two outermost fins and other fins between the two outermost fins, tops of the other fins forming a centrally upwardly protruding profile, the two outermost fins each forming a supporting plate horizontally extending toward the other fins;
    a pair of fan holders located between the two outermost fins and mounted at two opposite sides of a top of the heat sink, respectively, wherein each of the fan holders abuts against bottom surfaces of the supporting plates and the tops of higher ones of the other fins, and wherein each of the fan holders has a baffle plate extending downwardly to encompass the tops of the other fins; and a fan mounted on the fan holders and secured thereto.

17. The heat dissipation device as described in claim 16, wherein one of the fan holders further comprises a guiding plate extending slantingly and downwardly from a bottom end of the baffle plate.

* * * * *